United States Patent
Lee et al.

(10) Patent No.: US 9,461,213 B2
(45) Date of Patent: Oct. 4, 2016

(54) LED SUB-MOUNT AND METHOD FOR MANUFACTURING LIGHT EMITTING DEVICE USING THE SUB-MOUNT

(71) Applicant: Lextar Electronics Corporation, Hsinchu (TW)

(72) Inventors: Chia-En Lee, Chiayi (TW); Cheng-Ta Kuo, Hsinchu (TW); Der-Ling Hsia, New Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/175,419

(22) Filed: Feb. 7, 2014

(65) Prior Publication Data

US 2014/0231858 A1    Aug. 21, 2014

(30) Foreign Application Priority Data

Feb. 18, 2013    (TW) .............................. 102105551 A

(51) Int. Cl.
*H01L 33/48* (2010.01)
*H01L 33/62* (2010.01)

(52) U.S. Cl.
CPC ............. *H01L 33/486* (2013.01); *H01L 33/62* (2013.01); *H01L 2224/13* (2013.01)

(58) Field of Classification Search
CPC .............................. H01L 33/62; H01L 33/486
USPC ................................................... 257/710, 731
See application file for complete search history.

(56) References Cited

U.S. PATENT DOCUMENTS

| | | | |
|---|---|---|---|
| 6,720,664 B1 | 4/2004 | Teng et al. | |
| 7,205,648 B2 | 4/2007 | Shei et al. | |
| 7,834,375 B2 | 11/2010 | Andrews | |
| 2011/0101399 A1* | 5/2011 | Suehiro et al. | ................. 257/98 |
| 2011/0315956 A1* | 12/2011 | Tischler | ................. H01L 33/62 |
| | | | 257/13 |
| 2013/0069093 A1* | 3/2013 | Liu et al. | ........................ 257/98 |

FOREIGN PATENT DOCUMENTS

| | | |
|---|---|---|
| TW | 200836365 A | 9/2008 |
| TW | 201203636 A | 1/2012 |
| TW | 201300698 A | 1/2013 |

* cited by examiner

*Primary Examiner* — Caleb Henry
*Assistant Examiner* — Mounir Amer
(74) *Attorney, Agent, or Firm* — Hayes Soloway, P.C.

(57) ABSTRACT

A LED sub-mount includes a substrate body and a plurality of first electrical-conductive layers. The substrate body has a first surface. The first electrical-conductive layers are positioned on the first surface of the substrate body, wherein the first surface between every adjacent two of the first electrical-conductive layers has an adhesive-filling groove.

6 Claims, 7 Drawing Sheets

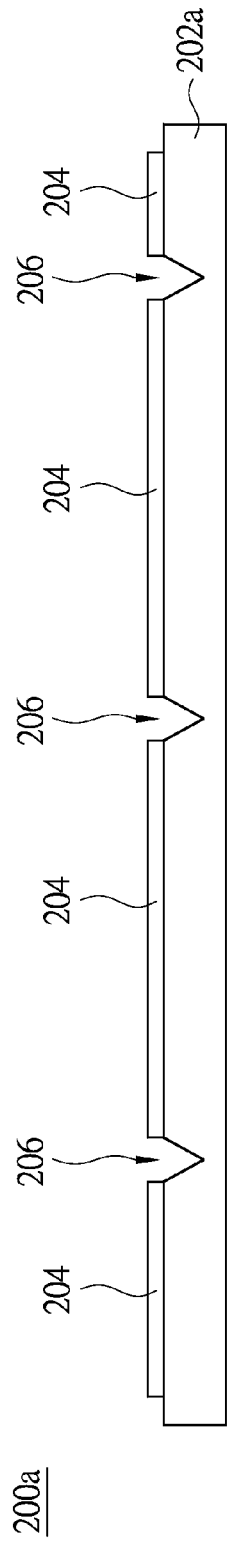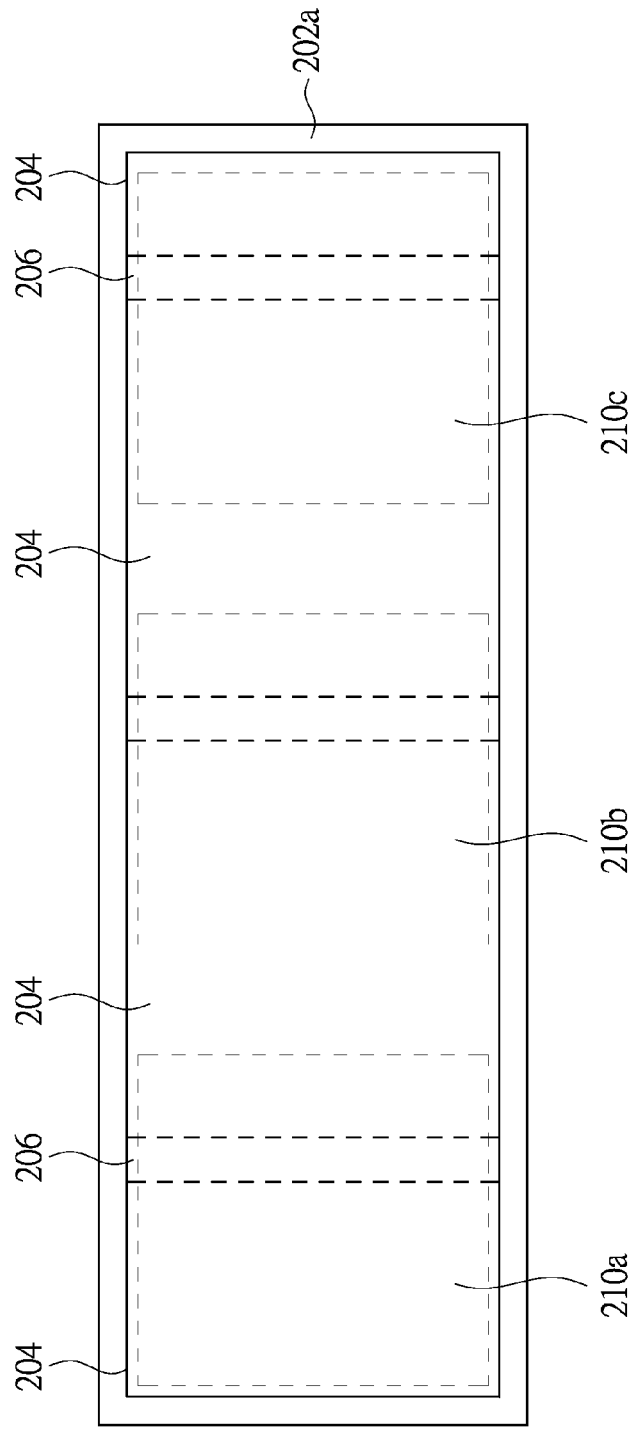

LED SUB-MOUNT AND METHOD FOR MANUFACTURING LIGHT EMITTING DEVICE USING THE SUB-MOUNT

RELATED APPLICATIONS

This application claims priority to Taiwan Application Serial Number 102105551, filed Feb. 18, 2013, which is herein incorporated by reference.

BACKGROUND

1. Field of Invention

The present invention relates to an LED sub-mount and a method for manufacturing the light-emitting device using the LED sub-mount.

2. Description of Related Art

A light emitting diode (LED) is a semiconductor light-emitting device, which is equipped with low power consumption, high luminous efficiency, long life and other environmental advantages that the traditional lights can hardly reach. In addition, different color LEDs, such as blue, ultraviolet, red and white LEDs were developed one by one, thereby making LEDs are more selective, and becoming one of the important light-emitting devices today.

A conventional LED chip is mounted on a substrate by several ways. For example, an adhesive may be dispensed on a bottom surface of an emitting diode chip and mount the emitting diode chip on the bonding area on the substrate with the adhesive. Another way is using a eutectic bonding process to mount an LED chip on the substrate, that is, the LED chip is fixed to the substrate by a flip-chip way and the LED chip has a eutectic layer on its electrode. When the eutectic layer on the electrode is heated over a eutectic temperature, the eutectic layer melts and rapidly cures so as to bond the LED chip on the substrate.

However, when the eutectic bonding process is used to mount an LED chip on the substrate, the LED chip may be damaged if a bottom substrate of the LED chip is removed by using a laser liftoff process. Without removing the bottom substrate of the LED chip, the light extraction efficiency of the LED chip can hardly be improved.

SUMMARY

It is therefore an objective of the present invention to provide an improved LED sub-mount and a method for manufacturing the light-emitting device using the LED sub-mount.

In accordance with the foregoing and other objectives of the present invention, a LED sub-mount includes a substrate body and a plurality of first electrical-conductive layers. The substrate body has a first surface. The first electrical-conductive layers are positioned on the first surface of the substrate body, wherein the first surface between every adjacent two of the first electrical-conductive layers has an adhesive-filling groove.

According to another embodiment disclosed herein, the substrate body further includes a second surface opposite to the first surface, the second surface has a plurality of second electrical-conductive layers disposed thereon, each of the second electrical-conductive layers is aligned with a corresponding first electrical-conductive layer and electrically connected with the corresponding first electrical-conductive layer via a through hole of the substrate body.

According to another embodiment disclosed herein, the substrate body includes a silicon substrate.

According to another embodiment disclosed herein, the adhesive-filling groove has a depth ranging from 5 microns to 100 microns.

According to another embodiment disclosed herein, the adhesive-filling groove has a width ranging from 25 microns to 500 microns.

In accordance with the foregoing and other objectives of the present invention, a light emitting device manufacturing method includes the steps of providing a sub-mount, which has a plurality of electrical-conductive layers, and a surface between every adjacent two of the electrical-conductive layers has an adhesive-filling groove; mounting an LED chip, which has a bottom substrate, on the sub-mount by a flip-chip way, and two electrodes of the LED chip are in contact with adjacent two of the electrical-conductive layers; filling an glue along the adhesive-filling groove to be guided into a gap between the LED chip and the sub-mount; and removing the bottom substrate of the LED chip.

According to another embodiment disclosed herein, the light emitting device manufacturing method further includes a laser liftoff step to remove the bottom substrate of the LED chip to expose a surface of the LED chip.

According to another embodiment disclosed herein, the light emitting device manufacturing method further includes a roughening treatment applied to the exposed surface of the LED chip.

According to another embodiment disclosed herein, the adhesive-filling groove has a depth ranging from 5 microns to 100 microns.

According to another embodiment disclosed herein, the adhesive-filling groove has a width ranging from 25 microns to 500 microns.

According to another embodiment disclosed herein, the light emitting device manufacturing method further includes a eutectic bonding process to mount the LED chip on the sub-mount.

Thus, the LED sub-mount and method for manufacturing the light-emitting device using the sub-mount disclosed herein enable the glue or adhesive to be easily filled into the adhesive-filling groove and guided into a gap between the LED chip and the sub-mount, thereby reducing the probability to damage LED chip while removing a bottom substrate of the LED chip using a laser liftoff step and improving the light extraction efficiency of LED chip. A roughening treatment is then applied to the exposed surface of the LED chips to enable the emitting light of the LED chips more uniform.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 3A illustrates a cross-sectional view of a LED sub-mount according to a third embodiment of this invention;

FIG. 3B illustrates a top view of the LED sub-mount in FIG. 3A;

DETAILED DESCRIPTION

Figure 1A:
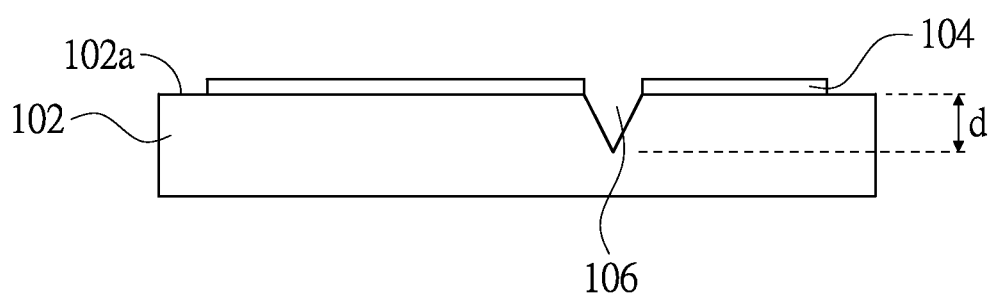
FIG. 1A illustrates a cross-sectional view of a LED sub-mount according to a first embodiment of this invention.

Reference will now be made in detail to the present embodiments of the invention, examples of which are illustrated in the accompanying drawings. Wherever possible, the same reference numbers are used in the drawings and the description to refer to the same or like parts.

In order to solve the drawbacks associated with the use of conventional eutectic layer flip-chip die-bonding process, the present invention provides a suitable LED sub-mount and manufacturing method using the LED sub-mount, such that the subsequent removal of a bottom substrate of the LED chip using a laser liftoff step has less probability to damage the LED chip and the light extraction efficiency of LED chip can be improved. The sub-mount and manufacturing method using the sub-mount are described in detail with the drawings.

Figure 1B:
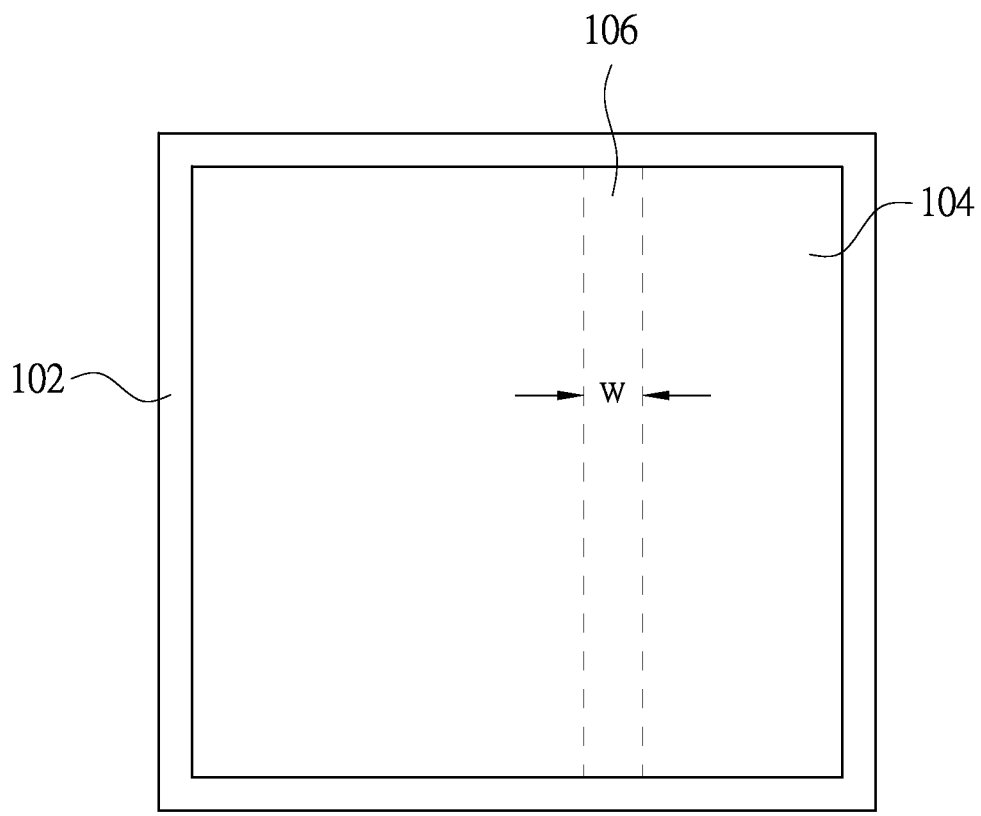
FIG. 1B illustrates a top view of the LED sub-mount in FIG. 1A.

Referring to both FIG. 1A and FIG. 1B, FIG. 1A illustrates a cross-sectional view of a LED sub-mount according to a first embodiment of this invention, and FIG. 1B illustrates a top view of the LED sub-mount in FIG. 1A. A sub-mount 100 includes a substrate body 102 and two first electrical-conductive layers 104. The first electrical-conductive layer 104 is positioned on a first surface 102a of the substrate body 102. A first surface between two (immediately) adjacent first electrical-conductive layers 104 has an adhesive-filling groove 106 thereon. The adhesive-filling groove 106 is used to be filled by a glue or adhesive. The adhesive-filling groove 106 is designed to have such dimensions for the glue or adhesive to be easily filled into the adhesive-filling groove 106 and guided into a gap between the LED chip and the sub-mount 100. In this embodiment, the adhesive-filling groove 106 has a depth (d) ranging from 5 microns to 100 microns, but not being limited to. The adhesive-filling groove 106 has a width (w) ranging from 25 microns to 500 microns, but not being limited to. In addition, the substrate body 102 may be a silicon substrate, but not being limited to.

Figure 2A:
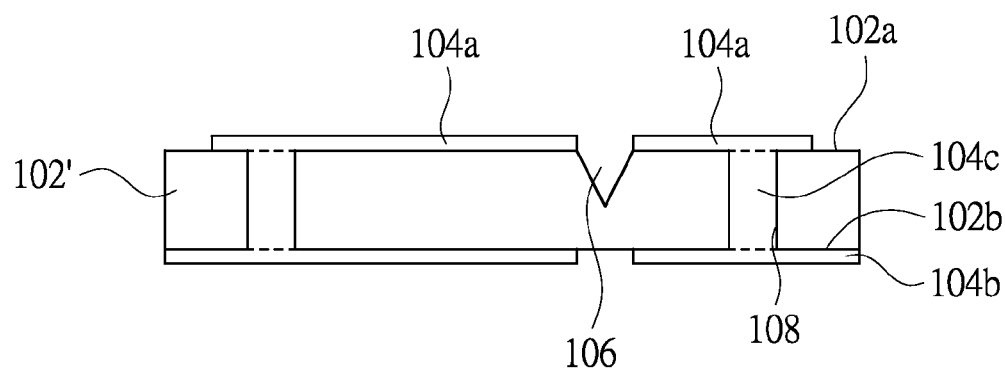
FIG. 2A illustrates a cross-sectional view of a LED sub-mount according to a second embodiment of this invention.
Figure 2B:
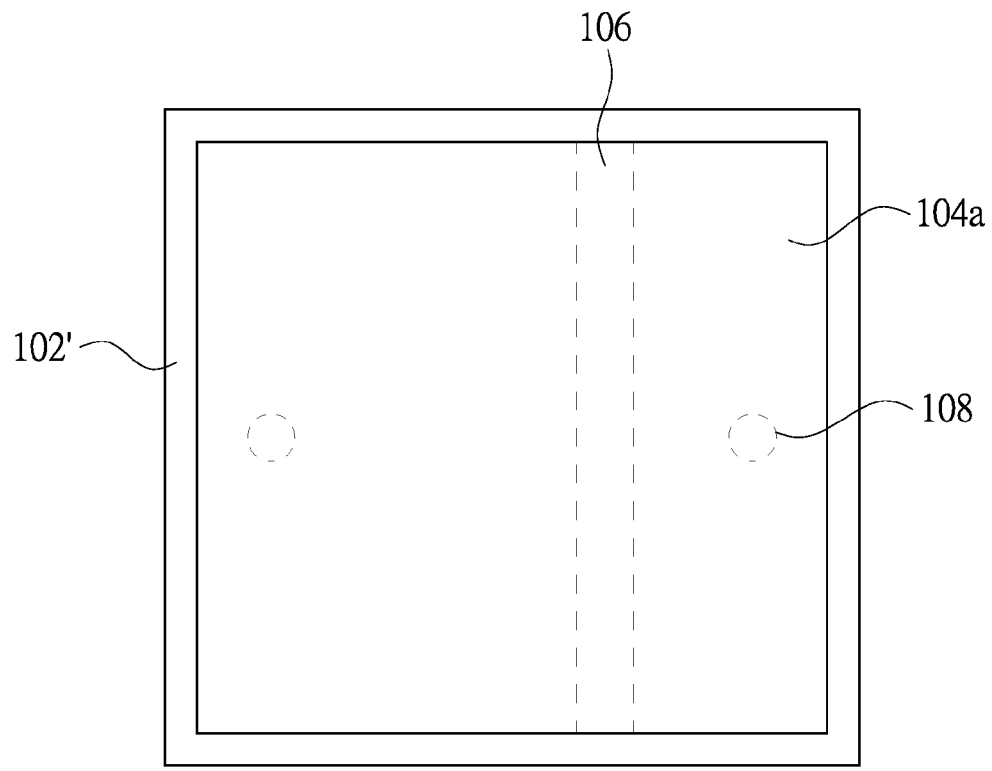
FIG. 2B illustrates a top view of the LED sub-mount in FIG. 2A.

Referring to both FIG. 2A and FIG. 2B, FIG. 2A illustrates a cross-sectional view of a LED sub-mount according to a second embodiment of this invention, and FIG. 2B illustrates a top view of the LED sub-mount in FIG. 2A. The second embodiment is different from the first embodiment in that the sub-mount 100' has electrical-conductive layers at two opposite surfaces thereof, and the sub-mount 100 has electrical-conductive layers at one side surface only. The sub-mount 100' includes a substrate body 102', two first electrical-conductive layers 104a and two second electrical-conductive layers 104b. The first electrical-conductive layer 104a is positioned on the first surface 102a of the substrate body 102' while the second electrical-conductive layer 104b is positioned on a second surface 102b of the substrate body 102'. The first surface 102a and the second surface 102b are two opposite surfaces of the substrate body 102'. In addition, each second electrical-conductive layer 104b is aligned with a corresponding first electrical-conductive layer 104a and is electrically connected with the corresponding first electrical-conductive layer 104a via a through hole 108 of the substrate body 102' (i.e., via an electrical-conductive layer 104c inside the through hole 108). The sub-mount 100' can be as a substrate for mounting a surface mounting device thereon. A first surface between two (immediately) adjacent first electrical-conductive layers 104a has an adhesive-filling groove 106 thereon. The adhesive-filling groove 106 is used to be filled by a glue or adhesive. The adhesive-filling groove 106 is designed to have such dimensions for the glue or adhesive to be easily filled into the adhesive-filling groove 106 and guided into a gap between the LED chip and the sub-mount 100'. Similarly, the adhesive-filling groove 106 has a depth ranging from 5 microns to 100 microns, but not being limited to. The adhesive-filling groove 106 has a width ranging from 25 microns to 500 microns, but not being limited to. In addition, the substrate body 102' may be a silicon substrate, but not being limited to.

Referring to both FIG. 3A and FIG. 3B, FIG. 3A illustrates a cross-sectional view of a LED sub-mount according to a third embodiment of this invention, and FIG. 3B illustrates a top view of the LED sub-mount in FIG. 3A. The third embodiment is different from the first embodiment in that the sub-mount 200a is used for mounting multiple LED chips thereon while the sub-mount 100 is used for mounting a single LED chip thereon only. The sub-mount 200a includes a substrate body 202a and four or more first electrical-conductive layers 204. The first electrical-conductive layer 204 is positioned on the first surface of the substrate body 202a. A first surface between two (immediately) adjacent first electrical-conductive layers 204 has an adhesive-filling groove 206 thereon such that the sub-mount 200a can be used to mount three LED chips (210a, 210b, 210c) thereon, and each LED chip crosses a corresponding adhesive-filling groove 206. The adhesive-filling groove 206 is used to be filled by a glue or adhesive. The adhesive-filling groove 206 is designed to have such dimensions for the glue or adhesive to be easily filled into the adhesive-filling groove 206 and guided into a gap between the LED chip and the sub-mount 200a. In this embodiment, the adhesive-filling groove 206 has a depth ranging from 5 microns to 100 microns, but not being limited to. The adhesive-filling groove 206 has a width ranging from 25 microns to 500 microns, but not being limited to. In addition, the substrate body 202a may be a silicon substrate, but not being limited to.

Figure 4A:
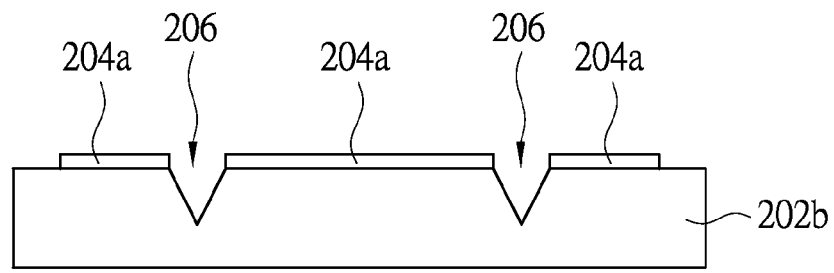
FIG. 4A illustrates a cross-sectional view of a LED sub-mount according to a fourth embodiment of this invention.
Figure 4B:
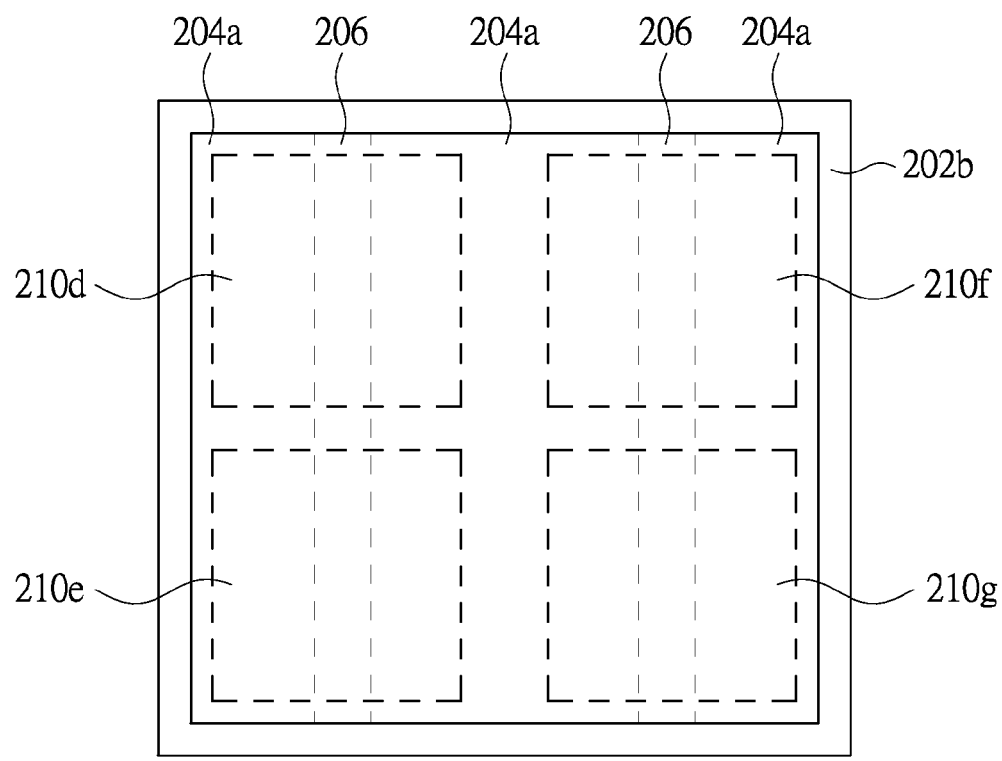
FIG. 4B illustrates a top view of the LED sub-mount in FIG. 4A.

Referring to both FIG. 4A and FIG. 4B, FIG. 4A illustrates a cross-sectional view of a LED sub-mount according to a fourth embodiment of this invention, and FIG. 4B illustrates a top view of the LED sub-mount in FIG. 4A. The fourth embodiment is different from the third embodiment in that the sub-mount 200b is used for mounting multiple LED chips in two-dimension array while the sub-mount 200a is used for mounting LED chips in one-dimension array. The sub-mount 200b includes a substrate body 202b and three first electrical-conductive layers 204a. The first electrical-conductive layer 204a is positioned on the first surface of the substrate body 202b. A first surface between two (immediately) adjacent first electrical-conductive layers 204a has an adhesive-filling groove 206, and the first electrical-conductive layer 204a is wider (compared with the first electrical-conductive layer 204). Therefore, the sub-mount 200b can be used to mount four LED chips (210d' 210e' 210f' 210g), and each LED chip crosses a corresponding adhesive-filling groove 206. The adhesive-filling groove 206 is used to be filled by a glue or adhesive. The adhesive-filling groove 206 is designed to have such dimensions for the glue or adhesive to be easily filled into the adhesive-filling groove 206 and guided into a gap between the LED chip and the sub-mount 200b. In this embodiment, the adhesive-filling groove 206 has a depth ranging from 5 microns to 100 microns, but not being limited to. The adhesive-filling groove 206 has a width ranging from 25 microns to 500 microns, but not being limited to. In addition, the substrate body 202a may be a silicon substrate, but not being limited to.

Figure 5A:
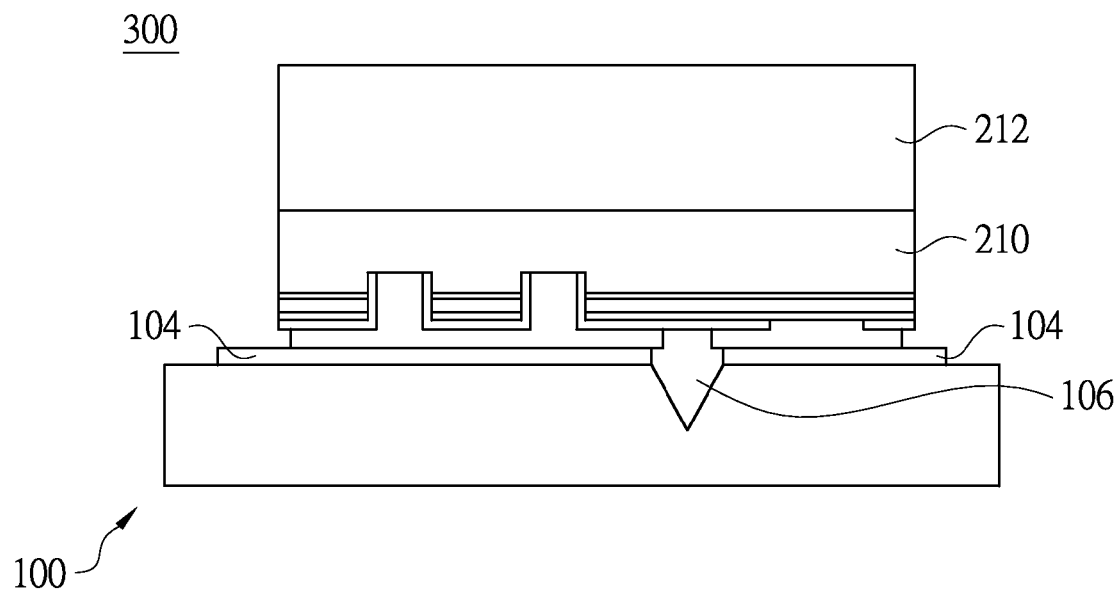
FIGS. 5A-5D illustrate a series of cross-sectional views to demonstrate a light emitting device manufacturing method according to an embodiment of this invention.
Figure 5B:
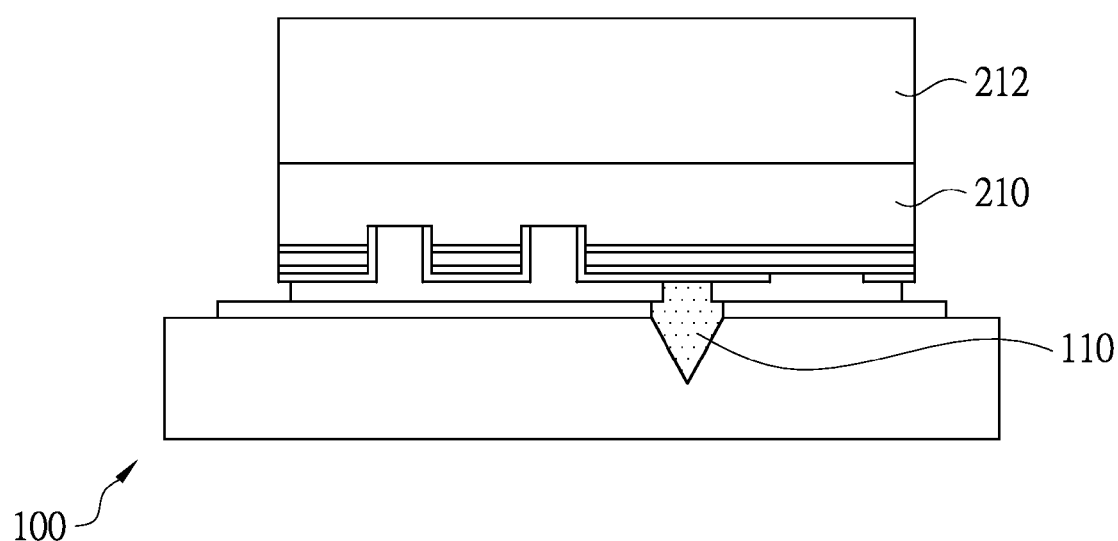
Figure 5C:
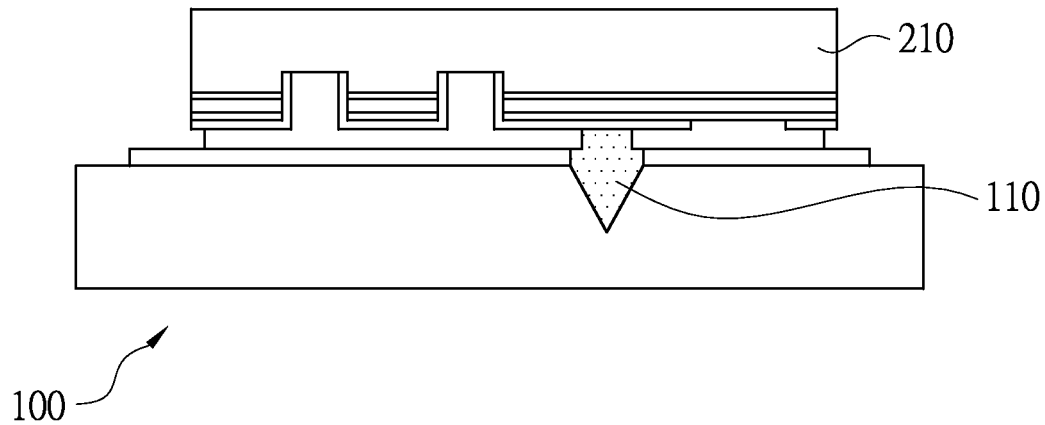
Figure 5D:
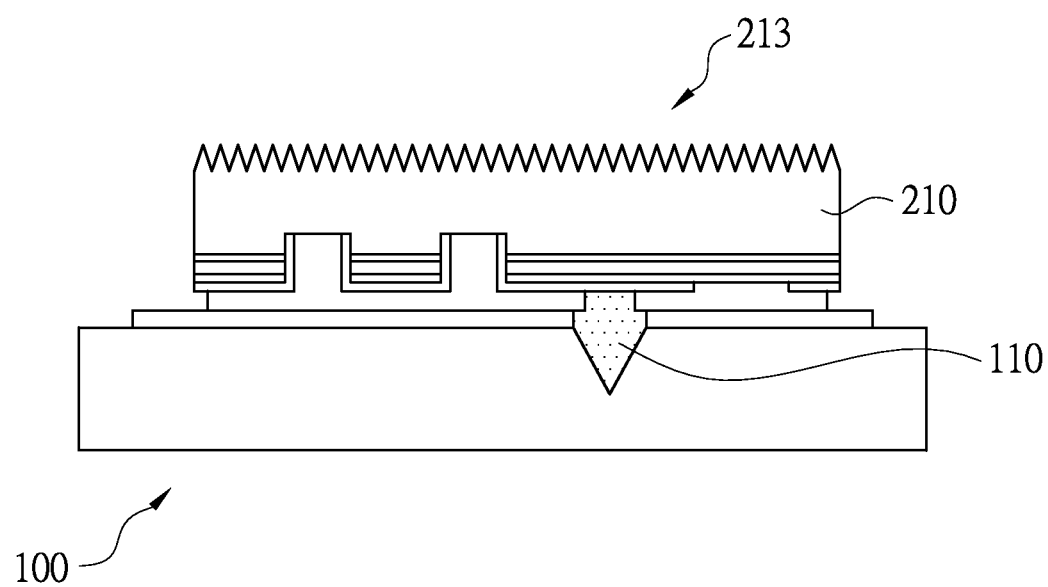

FIGS. 5A-5D illustrate a series of cross-sectional views to demonstrate a light emitting device 300 manufacturing method according to an embodiment of this invention. In FIG. 5A, a LED chip 210 with a bottom substrate 212 is mounted on a sub-mount 100 by a flip-chip way, and two electrodes of the LED chip 210 are in contact with adjacent two of the electrical-conductive layers 104. When the LED chip 210 is mounted on the sub-mount 100 by a eutectic bonding process, a gap between the LED chip 210 and the sub-mount 100 is less than 3 microns, which is not conducive to filling an adhesive to the gap between the LED chip 210 and the sub-mount 100. In FIG. 5B, the adhesive-filling groove 106 is designed to have such dimensions for the glue or adhesive 110 to be easily filled into the adhesive-filling groove 106 and guided into the gap between the LED chip 210 and the sub-mount 100. In FIG. 5C, when the glue or adhesive 110 filled into the adhesive-filling groove 106 is cured, a laser liftoff step may be used to remove the bottom substrate 212 of the LED chip 210 to expose a surface of the LED chip 210. Because the glue or adhesive 110 filled between the LED chip 210 and the sub-mount 100 is cured, the removing force applied to the bottom substrate 212 has less chance to damage the LED chip 210 when the LED chip 210 is reliably mounted on the sub-mount 100. In FIG. 5D, after removing the bottom substrate 212, an emitting surface of the LED chip 210 forms a rough surface 213 to enable the emitting light more uniform.

Figure 6:
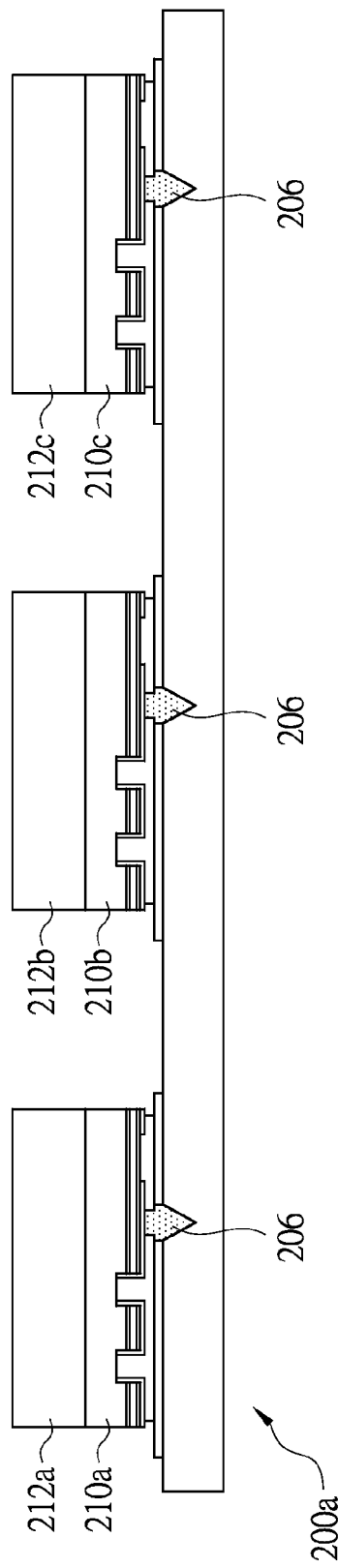
FIGS. 6-7 illustrate a series of cross-sectional views to demonstrate a light emitting device manufacturing method according to another embodiment of this invention.
Figure 7:
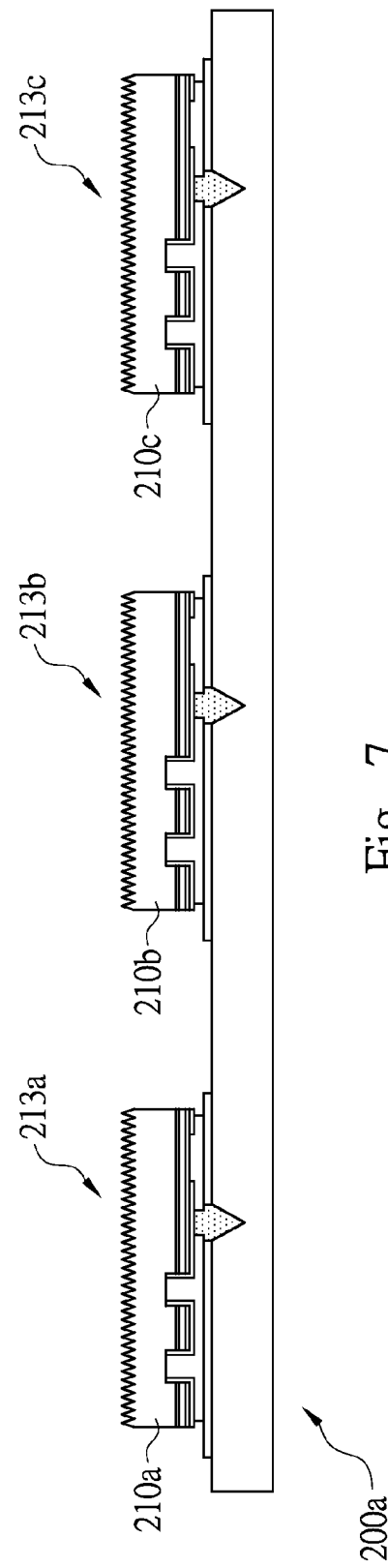

FIGS. 6-7 illustrate a series of cross-sectional views to demonstrate a light emitting device manufacturing method according to another embodiment of this invention. The manufacturing method of FIGS. 5A-5D is also used to mount multiple LED chips (210a, 210b, 210c) on the sub-mount 200a and fill the glue into the adhesive-filling groove 206. After the glue within the adhesive-filling groove 206 is cured, a substrate removal step, e.g., a laser liftoff step, is used to remove a bottom substrate (212a, 212b, 212c) of the LED chips (210a, 210b, 210c) so as to improve the light extraction efficiency of LED chip. A roughening treatment is applied to the exposed surface of the LED chips (210a, 210b, 210c) to form rough surfaces (213a, 213b, 213c) so as to enable the emitting light of the LED chips (210a, 210b, 210c) more uniform.

According to the above-discussed embodiments, the LED sub-mount and method for manufacturing the light-emitting device using the LED sub-mount disclosed herein enable the glue or adhesive to be easily filled into the adhesive-filling groove and guided into a gap between the LED chip and the sub-mount, thereby reducing the probability to damage LED chip while removing a bottom substrate of the LED chip using a laser liftoff step and improving the light extraction efficiency of LED chip. A roughening treatment is then applied to the exposed surface of the LED chips to enable the emitting light of the LED chips more uniform.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A light emitting diode device comprising:
a substrate body having a first surface;
a plurality of first electrical-conductive layers disposed on the first surface of the substrate body, wherein the first surface between every adjacent two of the first electrical-conductive layers has an adhesive-filling groove, and the adjacent two of the first electrical-conductive layers are in direct contact with an outer side surface of the adhesive-filling groove and not in direct contact with an inner side surface of the adhesive-filling groove;
an LED chip mounted on the first surface by a flip-chip way, the LED chip having both two electrodes confronting and being in direct contact with the adjacent two of the first electrical-conductive layers; and
a cured glue disposed within the adhesive-filling groove and being aligned immediately below the LED chip, and the cured glue being sandwiched between and in direct contact with both the LED chip and the substrate body.
2. The light emitting diode device of claim 1, wherein the substrate body further comprises a second surface opposite to the first surface, the second surface has a plurality of second electrical-conductive layers disposed thereon, each of the second electrical-conductive layers is aligned with a corresponding first electrical-conductive layer and electrically connected with the corresponding first electrical-conductive layer via a through hole of the substrate body.
3. The light emitting diode device of claim 1, wherein the substrate body comprises a silicon substrate.
4. The light emitting diode device of claim 1, wherein the adhesive-filling groove has a depth ranging from 5 microns to 100 microns.
5. The light emitting diode device of claim 1, wherein the adhesive-filling groove has a width ranging from 25 microns to 500 microns.
6. The light emitting diode device of claim 1, wherein the two electrodes are both located on a flat bottom side of the LED chip, and the flat bottom side of the LED chip confronts the adjacent two of the first electrical-conductive layers.

* * * * *